United States Patent
Bakke et al.

(10) Patent No.: US 9,236,281 B2
(45) Date of Patent: Jan. 12, 2016

(54) HEATING A FURNACE FOR THE GROWTH OF SEMICONDUCTOR MATERIAL

(75) Inventors: Per Bakke, Porsgrunn (NO); Egor Vladimirov, Brevik (NO); Pouria Homayonifar, Porsgrunn (NO); Alexandre Teixeira, Sandnes (NO)

(73) Assignee: REC SOLAR PTE, LTD., Singapore (SG)

( * ) Notice: Subject to any disclaimer, the term of this patent is extended or adjusted under 35 U.S.C. 154(b) by 172 days.

(21) Appl. No.: 14/234,357

(22) PCT Filed: Jul. 19, 2012

(86) PCT No.: PCT/EP2012/064241
§ 371 (c)(1),
(2), (4) Date: Apr. 30, 2014

(87) PCT Pub. No.: WO2013/014067
PCT Pub. Date: Jan. 31, 2013

(65) Prior Publication Data
US 2014/0248739 A1    Sep. 4, 2014

Related U.S. Application Data

(60) Provisional application No. 61/510,676, filed on Jul. 22, 2011.

(30) Foreign Application Priority Data

Jul. 22, 2011 (GB) .................................. 1112610.9

(51) Int. Cl.
*H01L 21/00* (2006.01)
*H01L 21/67* (2006.01)
*C30B 11/00* (2006.01)
*H01L 21/324* (2006.01)

(52) U.S. Cl.
CPC ........ *H01L 21/67098* (2013.01); *C30B 11/002* (2013.01); *C30B 11/003* (2013.01); *H01L 21/324* (2013.01); *H01L 21/67155* (2013.01)

(58) Field of Classification Search
None
See application file for complete search history.

(56) References Cited

U.S. PATENT DOCUMENTS

| 3,796,552 A | 3/1974 | Robinson et al. |
| 6,982,212 B2* | 1/2006 | Stolk ................ H01L 21/26513 257/E21.324 |
| 2007/0251937 A1 | 11/2007 | Dietrich et al. |
| 2008/0311417 A1 | 12/2008 | Eichler et al. |

FOREIGN PATENT DOCUMENTS

| DE | 3031747 A1 | 3/1982 |
| DE | 102008034029 A1 | 1/2010 |
| JP | 2000203981 A | 7/2000 |

* cited by examiner

*Primary Examiner* — Kyoung Lee
(74) *Attorney, Agent, or Firm* — Blank Rome LLP (57) ABSTRACT

A multi-ingot furnace for the growth of crystalline semiconductor material has one or more heating devices for heating a hot zone in which crucibles containing semiconductor material are received. At least one of the heating devices is arranged to apply a predetermined differential heat flux profile across a horizontal cross-section of the semiconductor material in one or more of the crucibles, the predetermined differential heat flux profile being selected in dependence the position of the one or more crucibles in an array. In this manner, the heating device can at least partially compensate for differences in the temperature across the semiconductor material that arises from its geometric position in the furnace. This reduces the possibility of defects such as dislocations during the growth of a crystalline semiconductor material. Associated methods are also disclosed.

18 Claims, 10 Drawing Sheets

HEATING A FURNACE FOR THE GROWTH OF SEMICONDUCTOR MATERIAL

REFERENCE TO RELATED APPLICATION

The present application is a National Stage of International Patent Application No. PCT/EP2012/064241, filed Jul. 19, 2012, which claims the benefit of U.S. Provisional Application No. 61/510,676 filed Jul. 22, 2011 and GB 1112610.9, filed Jul. 22, 2011, whose disclosures are hereby incorporated by reference in their entirety into the present disclosure.

FIELD OF THE INVENTION

The present invention relates to a multi-ingot furnace for the growth of crystalline semiconductor material, together with a method of operating such a furnace.

BACKGROUND TO THE INVENTION

Presently, the bulk volume of the world production of photovoltaic elements comprising solar panels is based on multi-crystalline silicon wafers cut from ingots that are cast by directional solidification (DS) based on the Bridgeman or Vertical Gradient Freeze (VGF) methods in electrically heated furnaces. The crucible being employed is usually made of silica $SiO_2$, and the furnaces have heating devices above, below and/or sideways with respect to the crucible to provide the heat for melting and control of heat extraction during the directional solidification. The process may be summarised as follows.

A crucible, open at the top, made of $SiO_2$ is covered in its interior with a silicon nitride containing coating and filled with a silicon feedstock to a predetermined height. The crucible is then placed on the floor of a process chamber of the furnace. Next, a circumferential support structure of graphite plates is attached along the outer crucible walls to provide mechanical support at elevated temperatures when the $SiO_2$ crucible sags. The furnace compartment is then closed, evacuated and the inert purge gas is supplied during the period when the heating elements are engaged so as to cause the melting/solidification of the silicon feedstock. When the silicon is melted, the heating is adjusted to obtain a directional solidification. An inert purge gas, usually argon, is flushed onto the surface of the silicon to protect against gaseous contamination and to provide effective removal of SiO gas for at least as long as the silicon is in the liquid phase.

One of the major challenges in these processes is to maintain a flat or slightly convex solidification front (as seen in the vertical direction from solid phase to melt) during the entire directional solidification process. This is considered important to minimise defects such as dislocations. Defects of this kind can have a deleterious effect on the suitability of the formed crystal for its purpose. For example, if the directionally solidified material is silicon which is to be processed into solar cells, defects such as dislocations can lead to deterioration in the efficiency of the ultimate solar cell.

Accordingly, as a consequence of a flat crystallization profile requirement, it is necessary to ensure that the temperature across the horizontal plane perpendicular to which the material solidifies is constant. However, given the relatively large size of production furnaces this is not easy to achieve due to non-uniform heat distribution related to the heat losses through the sides of the furnace.

In a simple, one-ingot furnace, a conventional design for a heating device disposed above the crucible usually consists of two parallel conductor rails connected by resistive heating elements which extend between and perpendicular to the rails. Heat is generated by passing current through the heating elements. While this design has benefits in terms of simplicity of manufacture and consequent cost, the uniform vertical heat flux initially produced by the heating device deteriorates at the sides of the furnace due to side cooling effects, therefore the net effect is a crystallization profile that is distorted from its intended flat shape. In this way, non-uniformity in the heat flux is detrimental to the quality of the produced crystalline material.

Moreover, these difficulties are increased when attempting to scale up the production of silicon wafers. Scaling of the production processes plays an important role in a reduction of a silicon wafer cost without compromising quality. Multi-ingot furnaces, which produce several ingots per run compared to one-ingot furnaces, represent an attractive economic solution. As a matter of fact, for a smaller ingot it is easier to control crystallization parameters and material uniformity within respective ingots, the latter results in a superior final quality of wafers. But despite obvious quality-related benefits, the production of multiple ingots of smaller size instead of one large ingot poses a major challenge with respect to the organization of correct heat fluxes in the furnace. In particular, the different positions of ingots within the furnace are not thermally equivalent, since they will be affected differently by the side cooling effects mentioned above. This leads to an inherent asymmetry in the heat flux across each ingot.

For example, consider a four-ingot furnace in which ingots are arranged in a 2×2 array. For each ingot, two sides are internal (i.e. facing another ingot) and the two other sides are external (i.e. facing the sides of the furnace). Whereas a single-ingot furnace at least retains a symmetry in the vertical heat flux around a central point of the ingot, this is no longer the case for the ingots in a multi-ingot furnace. The side heat losses may result in improper temperature gradients across each ingot and increased thermal stresses.

Another issue, which arises especially for relatively large ingots is a non-simultaneous finalisation of crystallization process. That is, the crystallization process is not completed simultaneously across the surface of an ingot. As a result, while when one part of the ingot is already fully crystallized, another part is still covered with molten material. The effect causes deviation from presumed cycle time of the production process.

Efforts have been made to improve the uniformity of the net heat flux provided by heating devices, the uniformity of action of heat extraction mechanisms, and insulation to negate factors relating to the overall design of the furnace, but there remains a need to further improve the performance of furnaces in this regard.

SUMMARY OF THE INVENTION

According to a first aspect of the present invention, there is provided a multi-ingot furnace for the growth of crystalline semiconductor material, the furnace comprising:
  a housing defining a hot zone for receiving an array of crucibles containing semiconductor material;
  at least one heating device for heating the semiconductor material;
  characterised in that
  the or each heating device is arranged to apply a predetermined differential heat flux profile to a horizontal cross-section of the semiconductor material in one or more crucibles, wherein the heat flux profile is selected in dependence on the position within the array of the one or more crucibles.

The present invention can help to compensate for variations in the temperature that arise across horizontal cross sections of semiconductor material in a furnace by providing a modulated heat flux from the heating device as a function of the position of that material inside the furnace. It attempts to avoid variations due to positioning asymmetry in the heat loss characteristics of a multi-ingot furnace for each respective ingot by introducing complementary asymmetry, for example by providing heating devices of unconventional geometry. The present invention can ensure that these variations complement each other in such a way as to increase the uniformity of temperature across a lateral cross-section of the semiconductor material. The heating device may produce the differential heat flux profile through its physical geometry, chemical composition or other characteristics, or through a combination of such characteristics. The array of crucibles may be any distribution of a plurality of crucibles, but in preferred embodiments is a regular two-dimensional array. In particular, the array may be a close packed array. The horizontal cross-section is a planar cross-section of the semiconductor material. The horizontal cross-section may be the surface of the semiconductor material or may be a cross-section taken through the semiconductor material beneath the surface.

The invention is applicable to a number of semiconductor growth multi-ingot furnaces and is particularly applicable to the furnaces for melting and directional solidification of silicon in Bridgeman or Vertical Gradient Freeze (VGF) processes. The present invention can help to ensure that the solid-liquid interface (i.e. the crystallization front) of the crystallizing material is substantially planar by maintaining superior uniformity of temperature across the horizontal cross-section in the vicinity of crystallization front. In this way, the number of defects such as dislocations, which occur as a result of thermal stresses in the material can be reduced.

In addition to silicon, the invention is beneficial for the growth of a number of other materials, including elements in groups III to V of the Periodic Table, combinations of these elements such as GaAs, GaP, ternary combinations of elements in these groups and compounds of elements in groups II to VI of the Periodic Table.

Preferably, the furnace comprises a plurality of heating devices, wherein each heating device is associated with a single crucible and is arranged to apply a predetermined differential heat flux profile across the horizontal cross-section of semiconductor material in the associated single crucible. Accordingly, each heating device can be used for material in a particular crucible, and can be optimised towards the position of that crucible. In alternative embodiments, the or each heating device may be arranged to apply a predetermined heat flux profile across the horizontal cross-section of semiconductor material in a plurality of crucibles, thereby reducing the number of heating devices required.

In preferred embodiments, the predetermined differential heat flux profile comprises only one plane of symmetry perpendicular to the horizontal cross-section of the semiconductor material, and the plane of symmetry passes through a geometric centre of the array. Accordingly, the heat flux profile has no more than one plane of symmetry perpendicular to the horizontal cross-section of the semiconductor material, thereby ensuring that the profile has a suitable degree of asymmetry to address the non-uniformity in the heat loss properties of the semiconductor material that arises from the crucible's position in the array.

The heat flux profile can at least in part be a result of the physical geometry of the heating device. As a result, in some preferred embodiments the physical geometry of the heating device is symmetrical with respect to the plane of symmetry of the predetermined differential heat flux profile which passes through a geometric centre of the array.

In some preferred embodiments, the predetermined heat flux profile varies along a line of intersection between the horizontal cross-section of the semiconductor material and the plane of symmetry of the predetermined differential heat flux profile which passes through a geometric centre of the array. For example, if the heating device applies the heat flux profile to semiconductor material in a crucible placed at the corner of the array, it may be preferable to apply increased heat flux at the outer corner of the crucible.

The heating device may be any known or conceivable heating means. In preferred embodiments, however, the heating device is a resistance heater. Accordingly, the heating device may comprise one or more heating elements. Heat is generated in such a heating device by passing current through the one or more heating elements, which are resistive. The current applied may be alternating current (AC) or direct current (DC). The heating elements may take any appropriate form, such as a coil, wire, strip, sheet and so on.

In preferred embodiments, the heating device comprises one or more heating elements extending between conductor rails. This arrangement allows the conductor rails to be used to simultaneously apply current to all the heating elements. In preferred embodiments, each heating device comprises a plurality of heating elements. For reasons of robustness and mechanical integrity some of the sections of different heating elements or of the same heating element may be connected to each other.

Preferably, there are provided at least two differing configurations of heating element. These configurations can vary in physical geometry, material properties or both.

In some preferred embodiments, at least one of the heating devices may be provided with conductor rails which are parallel to one another. Preferably, at least one resistive heating element is configured to generate a variable total heat flux per unit length projected on a line passing through its contact points with a power supply. The contact points may be contact points with the conductor rails, for example. This means that the heat flux generated by that heating element is relatively greater at certain points along this line, thus contributing more heat flux to the heat flux profile in the region covered by these points of the heating element. In some preferred embodiments, the line passing through the contact points is perpendicular to the conductor rails.

Preferably, at least one heating element comprises: at least one primary section in contact with one of the conductor rails; one or more secondary sections, wherein the at least one primary section and the one or more secondary sections extend parallel to the linear axis, and are offset from one another, and a connecting section extending between at least one primary section and the one or more secondary sections, such that increased total heat flux per unit length projected on a line passing through its contact points occurs in the region of the connecting section. In comparison with a heating element which extends directly between the conductor rails, this arrangement provides additional heat flux in the region of the connecting section. The additional heat flux can be used to compensate for relatively high heat loss characteristics of the furnace in the region in which it is provided.

In preferred embodiments, the at least one heating element comprises a plurality of secondary sections. In this manner, a single connecting section can extend over a significant distance without undesirably increasing the distance between secondary sections. Preferably, secondary sections are disposed either side of the primary section. This means that the connecting section extends in more than one direction from the primary section, limiting the turning moment applied to the junctions between primary sections, secondary sections, and the connecting section due to a reduced distance between them. This reduces the risk of mechanical failure of the heating element.

In preferred embodiments, the at least one heating element comprises one less primary section in contact with a first of the conductor rails than secondary sections. For example, if there are three secondary sections there may be two primary sections in contact with one of the conductor rails. Thus, in some preferred embodiments, there may be a plurality of primary sections. In particularly preferred embodiments, there is a plurality of primary sections interspersed with secondary sections in a direction parallel to the conductor rails. This provides a particularly stable arrangement while simultaneously allowing for increased heat flux in the vicinity of the connecting section.

In preferred embodiments, a plurality of process chambers are provided within the hot zone, and each process chamber is arranged to receive at least one crucible of the array. More preferably, each process chamber is arranged to receive a single one of the crucibles. In this way, conditions, such as atmospheric conditions, for each crucible can be individually controlled. Moreover, each heating device is preferably arranged to provide heat to a given process chamber. Accordingly, the heat flux profile across the semiconductor material in each crucible can be carefully managed by an individual heating device.

In some preferred embodiments, the or each heating device comprises a plurality of heating elements arranged in a plurality of groups, wherein the heating device further comprises an independent power supply for each group. In this way, the power applied to separate heating elements may be varied.

Heating elements in the heating device may be connected in parallel or in series, according to requirements.

Preferably, the furnace further comprises a separator or several separators disposed between each heating device and the semiconductor material. The separator serves as a secondary source of infra-red radiation and facilitates further vertical heat flux improvement in order to organize a desired heat distribution resulting in a flat horizontal crystallization front profile.

The at least one heating device is preferably a top heating device disposed above the process chamber. These types of heating devices are preferred if the chamber is to be used for a Bridgeman process, since it is desirable in this context to allow a main temperature gradient vertically in the chamber, i.e. in a direction perpendicular to the open face of the crucible, and this can be achieved by selectively applying heating from above and below the crucible. Nevertheless, there may additionally or alternatively be heating devices disposed to the side of the crucible if required.

In preferred embodiments, the at least one heating device may be disposed within a heater chamber which is separated from the process chamber by a separator. This has the advantage of protecting the heating device from deteriorating gases originating from the material to be heated and/or the material constituting the interior of the process chamber. The separator may be a top separator suspended above the process chamber, and the heater chamber may be an integral part of the furnace cover. Alternatively or additionally, a bottom separator may be provided, similar to a top separator, and which may be an integral part of a bottom support structure for the crucible. Other separator geometries are also contemplated. Preferably such separators have conformal opposing surfaces (for example parallel surfaces in the case of flat surfaces). An example of such a separator is a frusto-conical top separator in which the apex of the frusto-conical shape is directed towards the centre of the crucible and positioned above the semiconductor material.

A bottom support structure may be provided as a load carrying structure of graphite or another heat conductive and mechanically rigid material, for supporting the crucible and other structures/devices placed in the process chamber. The bottom support structure may form a horizontally oriented partition (wall) or floor covering the entire cross-section area of the process chamber and thus allowing a further chamber to be disposed beneath the process chamber. In this case, the further chamber may be used to hold at least one heating device below the crucible. Thus the bottom support may act as a separator. This provision has the advantage of protecting a lower heating device from deteriorative gases which occur during the process. However, the present invention may also be applied to furnaces with any type of conceivable load carrying support structure for carrying the crucible, including furnaces where the crucible is placed directly onto the bottom floor of the process chamber.

The heating elements are preferably formed of a material which has properties compatible with the process. Accordingly, the material should be able to withstand high temperatures associated with the process without decomposing or in any other way releasing (by gassing, perspiration, flaking etc.) contaminating compounds. The material preferably also withstands the required temperature without loss of mechanical rigidity. The material should also preferably be chemically inert to chemicals likely to be found during the process. For example, if the furnace is used to process silicon, the heating elements should preferably be formed of a material that is chemically inert to the chemical environment encountered in crystallization furnaces for manufacturing multicrystalline silicon ingots. The temperatures the heating elements are preferably able to withstand up to 1000 degrees Celsius, 1250 degrees Celsius, 1500 degrees Celsius, 2000 degrees Celsius or even higher.

In preferred embodiments, the heating elements may be formed of graphite foil manufactured from exfoliated natural graphite, without fillers or binders or carbon fiber reinforced carbon (CFRC). Alternatively, other materials may be used, such as any material compatible with the melting and crystallization of silicon.

In accordance with a second aspect of the present invention, there is provided a method of operating a furnace for the growth of a crystalline semiconductor material, wherein the method comprises heating a process chamber using a heating device which applies a predetermined differential heat flux profile to a horizontal cross-section of semiconductor material within one or more crucibles, the predetermined differential heat flux profile being selected in dependence on the position of the one or more crucibles within an array. In general the method of second aspect may be used with the furnace of the first aspect, and thus preferred features of the first aspect may also be applied to the second aspect of the invention.

According to a third aspect of the present invention, there is provided a method of growing crystalline semiconductor material, comprising:
  loading a furnace process chamber with material to be heated; closing the furnace;
  evacuating the air within the process chamber;
  causing a flow of process gas at desired pressures from one or more heating chambers of the furnace to the process chamber;

heating the material while performing the method according to the second aspect;
cooling the material;
evacuating the gas
aligning the pressure in the process chamber to atmospheric pressure;
opening the furnace; and
removing the material.

In preferred embodiments, the crystalline semiconductor material of all aspects of the invention is for use as photovoltaic material for converting incident radiation into electrical charge.

BRIEF DESCRIPTION OF THE DRAWINGS

Exemplary embodiments of the present invention will now be described with reference to the accompanying drawings, in which.

DETAILED DESCRIPTION

Preferred embodiments of the present invention will now be described with reference to the accompanying drawings. Each of the preferred embodiments shows multi-ingot furnaces which comprise heating devices which generate non-uniform heat flux profiles. The furnaces can be used for the growth of a crystalline semiconductor material, particularly silicon by a directional solidification method such as the Bridgeman process. In particular, the silicon produced in this way may be silicon for use as photovoltaic material for converting incident radiation into electrical charge.

Figure 1:
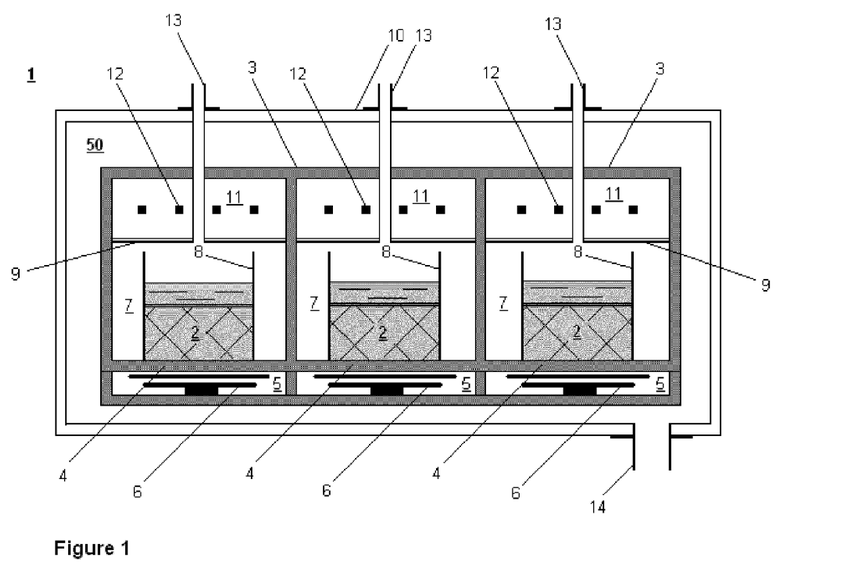
FIG. 1 shows a schematic section through a furnace according to a preferred embodiment of the present invention.

A side view of a multi-ingot furnace 1 according to a first preferred example embodiment of the present invention is shown in FIG. 1. The furnace comprises a hot zone 50 confined by heat insulating walls 3. The heat insulating walls 3 may be formed substantially of graphite, and may in particular be formed of a graphite felt with a carbon fibre composite lining.

The hot zone 50 of the furnace 1 comprises a number of process chambers 7 in which the semiconductor crystalline material may be grown. Together with each process chamber 7, there is also provided an upper heater chamber 11, and a lower heat extraction chamber 5. Each process chamber 7 is separated from its upper heater chamber 11 by a top separator 9 and from its lower heat extraction chamber 5 by a bottom separator 4. The top separator 9 and the bottom separator 4 are horizontal partition walls and are formed of graphite.

Heat extraction means 6 are provided in the lower heat extraction chambers 5. The heat extraction means 6 may be water or gas cooling mechanisms or other appropriate means for extracting heat from the process chambers 7.

The heat insulating walls 3 containing the hot zone 50 are typically formed from thick graphite (about 30 cm thick) and provide good thermal insulation. However, the hot zone 50 is not gas tight. In order to provide a gas-tight chamber and some further thermal insulation the hot zone is typically provided within a housing 10. Preferably such a housing 10 is a water-cooled housing and surrounds the walls of heater and process chambers. The walls of the housing 10 are separated from those of the hot zone 50 by a gas-filled volume, the volume providing further thermal insulation and containing exhaust gas (process gas plus any contaminants) from the hot zone 50. The housing 10 may comprise a water-cooled steel shell or other type of externally cooled, mechanically rigid and gas-tight structure enclosing the hot zone. The housing 10 is gas tight to allow for elevated temperatures at vacuum pressures. For loading and unloading the material to/from the furnace hot zone the housing normally contains a detachable arrangement (cover or door) in which parts of the hot zone may be integrated.

The process chambers 7 are arranged to receive a crucible 2 on the bottom separator 4 which separates the lower heat extraction chamber 5 from the process chamber 7. The crucible 2 is formed of silica coated with a slip coating of silicon nitride. The furnace 1 further comprises support plates 8 to mechanically support the crucible. The plates 8 of the first preferred embodiment are formed of graphite or silicon carbide coated graphite. Alternatively, the plates 8 may be formed of another chemically inert material with respect to silicon dioxide, such as silicon nitride. The crucible 2 is arranged to receive silicon to be crystallized by the Bridgeman process by melting and solidification.

In some preferred embodiments, the furnace 1 further comprises inlets 13 which can provide process gas (argon, helium, hydrogen containing species etc.) to the process chambers 7 through the upper part of the furnace, and a gas outlet 14 from the furnace 1. Furthermore, the furnace 1 may further comprise one or more outlets from the process chamber 7 for removing contaminated process gas. The outlets may be disposed, for example, symmetrically on either side of each chamber 7, although other arrangements are possible. In particular, the number of inlets and outlets can be varied as required.

Top heating devices 12 are provided in the upper heater chambers 11. Each top heating device 12 can heat silicon within an associated crucible 2 in the adjacent process chamber 7. The top heating devices 12 are designed to provide predetermined differential heat flux density profiles across a horizontal cross-section of the silicon, the differential heat flux density profiles of the top heating devices 12 being selected in dependence on heat flux characteristics of the furnace 1 in use. In particular, the predetermined differential heat flux density profile of a given top heating device 12 will depend on the position of its associated crucible 2 within the array of crucibles 2 in the furnace 1. For example, where the crucible 2 is on the edge of the array, it may be decided that the side of the crucible 2 which is disposed away from any other crucibles 2 requires greater heat flux from the heating device 12 since it will lose heat at a greater rate than the side which is disposed towards an adjacent crucible 2. So by choosing the predetermined heat flux profile according to the position of the crucible 2 within the array, one can assist in ensuring that there is ideally no horizontal temperature gradient in the lateral cross-section of the ingot of semiconductor material within the crucible 2, during use. In preferred embodiments, the top heating device 12 is a resistance heater.

In the preferred embodiment shown in FIG. 1, there are three process chambers 7 illustrated side-by-side. These form part of a larger array of process chambers 7, such that each feature within or associated with each process chamber 7 is also provided in a 3×3 array. Accordingly, the furnace 1 of the preferred embodiment of FIG. 1 comprises nine process chambers 7 and may receive an array of nine crucibles 2 containing silicon, or another material from which crystalline semiconductor material is to be grown. However, in other preferred embodiments, other arrays of crucibles may be provided for, such as 2×2 or 2×1 arrays. In general, any number of crucibles may be provided in any configuration.

In preferred embodiments, each process chamber 7 receives a single crucible 2. Accordingly, the array of crucibles 2 has a corresponding array of process chambers 7 for receiving those crucibles 2.

Figure 2A:
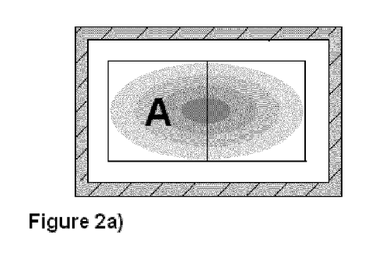
FIG. 2a) shows a schematic experimental temperature distribution arising under uniform heating in the lateral direction across a furnace comprising a 2×1 array of process chambers.
Figure 2B:
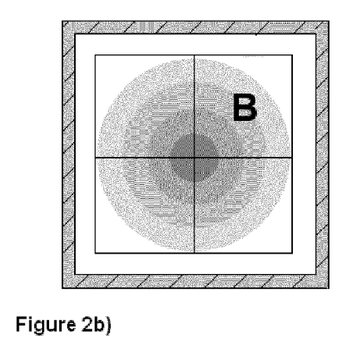
FIG. 2b) shows a schematic experimental temperature distribution arising under uniform heating in the lateral direction across a furnace comprising a 2×2 array of process chambers.
Figure 2C:
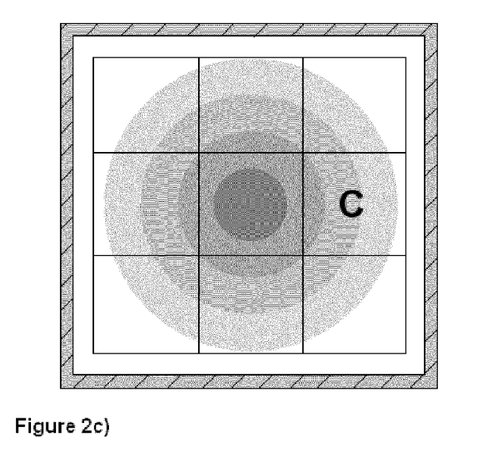
FIG. 2c) shows a schematic experimental temperature distribution arising under uniform heating in the lateral direction across a furnace comprising a 3×3 array of process chambers.

FIG. 2 is a plan view of some exemplary arrays of process chambers 7 within a furnace 1, and also illustrates the temperature distribution across a horizontal plane of the furnace 1 that may arise if a uniform heat source were applied to the process chambers. In each case, it can be seen that the application of a uniform heat flux would create a hot spot in the centre of the furnace 1, and cooler areas towards the edge of the furnace 1.

In particular, FIG. 2a) illustrates a furnace 1 comprising a 2×1 array of process chambers 7. The heat distribution pattern shown across the Furnace 1 of FIG. 2a) illustrates that the hottest region is at the centre of the Furnace 1, while the sides of the furnace 1 are at a lower temperature. Thus semiconductor material in a crucible in the process chamber marked as position A in FIG. 2a) will experience a higher temperature at its right-hand side (as viewed in the Figure) than at its left-hand side.

FIG. 2b) illustrates a furnace comprising a 2×2 array of process chambers. Again, the temperature distribution pattern shown in FIG. 2b) shows that the greatest heat is present at the centre of the furnace 1 when it is under uniform heating. In FIG. 2b), position B is marked. It can be seen in this Figure that the process chamber 7 shown in position B has a greatest temperature at its lower left-hand corner.

FIG. 2c) illustrates a furnace comprising a 3×3 array of process chambers 7, such as that illustrated in FIG. 1. In this case, the central process chamber 7 at the centre of the array contains the hot spot of the temperature distribution pattern, while the process chambers 7 on the edge of the array are cooler at greater distance from this hot spot. For example, the process chamber at position C has a greater temperature at its lower edge than at its upper edge.

The temperature distribution patterns shown in FIGS. 2a) to 2c) schematically represent generalisations from experimental observations (for example, by resistivity mapping of boron doped silicon ingots) for ingots crystallized under heaters which apply uniform heat flux across the surface of the ingots. As can be seen from FIGS. 2a) to 2c), significant temperature variations can occur across a single chamber 7 due to the influence of side cooling effects. This can mean a temperature variation in a horizontal plane across an ingot of material which is being directionally solidified. Such temperature variations can detract from the quality of the resulting crystalline material. In order to mitigate against this, the furnace 1 of the present invention does not apply a uniform heat flux across the process chambers 7, but instead applies a predetermined differential heat flux profile across a horizontal cross-section of the material which can counteract the effects illustrated in FIGS. 2a) to 2c). For example, where FIGS. 2a) to 2c) illustrate that a region would be cold on application of a uniform heat flux, the present invention can apply an increased heat flux. Conversely, where a uniform heat flux would cause a region to be relatively hot, the present invention can apply a reduced heat flux.

Figure 3A:
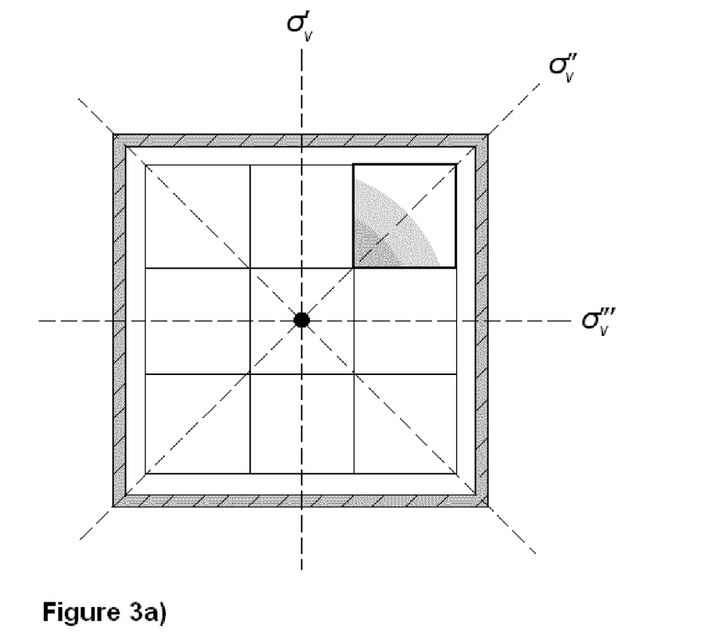
FIG. 3a) shows a plan view illustrating vertical planes of symmetry in the temperature distribution within a furnace comprising a 3×3 array of process chambers.
Figure 3B:
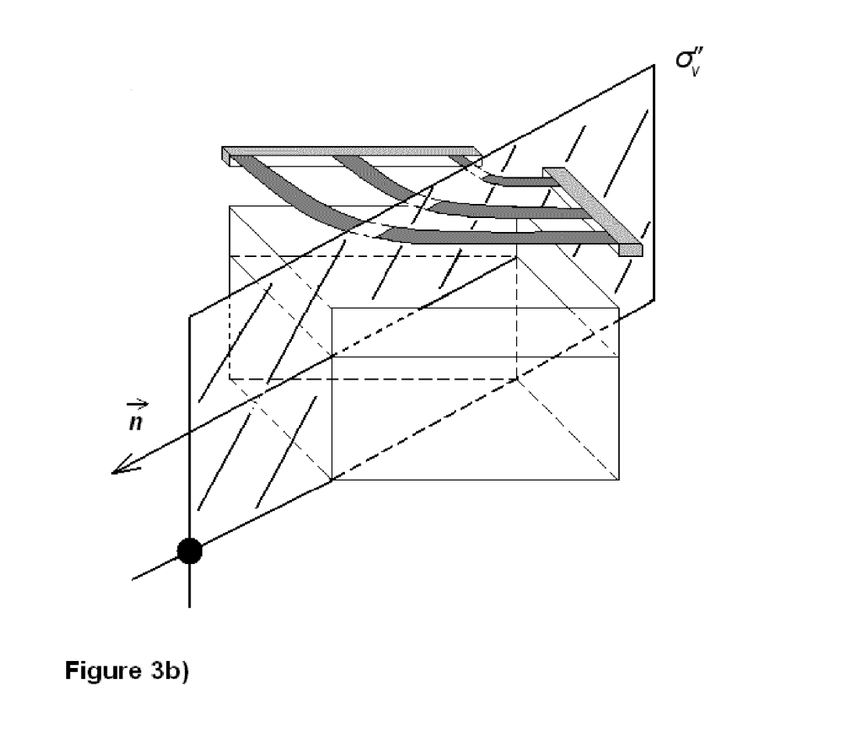
FIG. 3b) shows a perspective view of a vertical plane of symmetry passing through a single process chamber.

It should be appreciated that while the temperature distribution may be non-uniform even under the application of a uniform heat flux from the heating device, there may nevertheless remain certain symmetries in the system. FIGS. 3a) and 3b) illustrate these symmetries in a multi-ingot furnace having a 3×3 array of process chambers. Like FIG. 2c), FIG. 3a) shows a plan view of such a furnace. FIG. 3a) indicates vertical planes of symmetry $\sigma'_v$, $\sigma''_v$, $\sigma'''_v$ within the temperature distribution of such a furnace under uniform heating. The vertical planes of symmetry are perpendicular $\sigma'_v$, $\sigma''_v$, $\sigma'''_v$ to the horizontal cross-section of the semiconductor material held by the crucibles 2 in each process chamber 7, as can be most easily seen from FIG. 3b), which illustrates the plane of symmetry $\sigma'''_v$ passing through a chamber in a corner position of the 3×3 array. The intersection of a plane of symmetry with a horizontal cross-section of the semiconductor material is indicated in FIG. 3b) and subsequent Figures by the symbol $\vec{n}$.

It is noted that each of the peripheral chambers of the 3×3 array contain one and only one plane of symmetry $\sigma'_v$, $\sigma''_v$, $\sigma'''_v$. Since the heating device 12 of the preferred embodiment is designed to compensate for the unwanted variation in temperature illustrated in FIGS. 2a) to 2c), the heat flux profile applied by the heating device 12 will share the same planes of symmetry.

Figure 4:
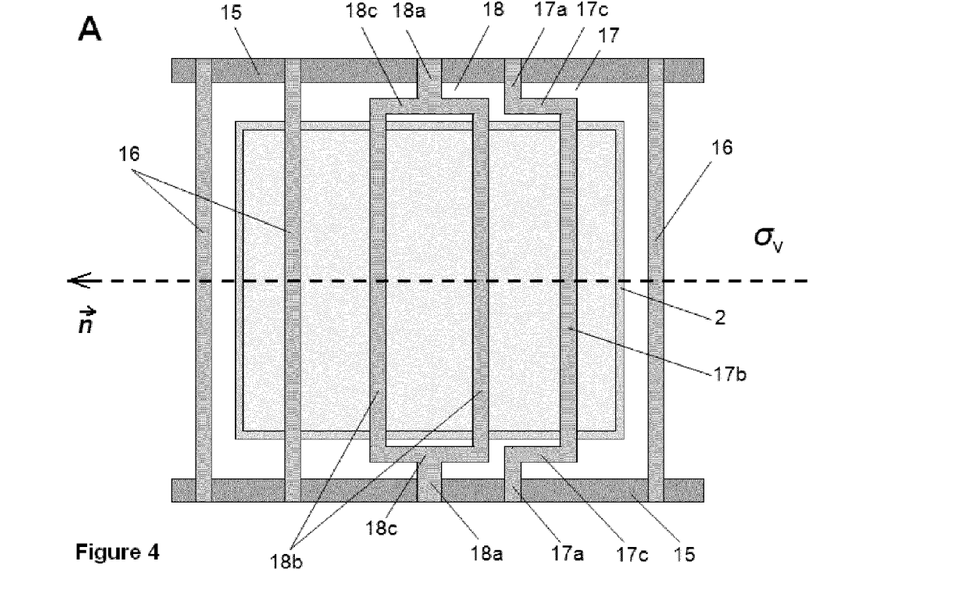
FIG. 4 is schematic plan view of an arrangement of a heating device in accordance with the present invention.

The arrangement of the top heating device 12 of one preferred embodiment is shown in more detail in FIG. 4, which is a plan view showing the position of the top heating device 12 above the crucible 2. For illustrative purposes, the separator 9 is not shown in FIG. 4, although the skilled person will appreciate that this may impede the line of sight between the top heating device 12 and the crucible 2 in practice.

The heating device 12 illustrated in FIG. 4 is designed to be disposed in a position such as position A shown in FIG. 2a). As can be seen from FIG. 2a), if uniform heating were applied to a process chamber 7 in this position then the temperature of that chamber 7 would be increased towards the right. The upper and lower parts of the chamber 7 as seen shown in FIG. 2a) would also be cooler relative to the central area of the chamber 7.

The top heating device 12 comprises two parallel conductor rails 15. Heating elements 16, 17, 18 are provided which extend between the conductor rails.

These comprise three straight heating elements 16, an extended heating element 17, and a multiple junction element 18. The heating elements 16, 17, 18 are resistive heating elements which dissipate power to create a heat flux when a current is passed through them.

The arrangement of the heating device 12 shown in FIG. 4 is not symmetrical from left to right. As a result, a differential heat flux profile is applied across a horizontal cross-section of the semiconductor material in the crucible 2. In particular, the heating device 12 shown in FIG. 4 is arranged to produce a greater heat flux towards the left than is produced towards the right. This compensates for the natural behaviour of a process chamber in position A as indicated by the temperature distribution pattern shown in FIG. 2.

The arrangement of the heating device 12 of FIG. 4 also provides increased heat flux in upper and lower regions as viewed from position shown in that Figure. This is achieved through the particular manner in which the extended heating element 17 and the multiple junction heating element 18 are formed.

The heat flux profile provided by and the physical geometry of the heating device 12 of FIG. 4 are symmetrical around the plane of symmetry $\sigma_v$ which extends perpendicular to the horizontal cross-section of the semiconductor material. This is the only plane of symmetry for the heat flux profile and runs through the centre of the array.

The extended heating element 17 and the multiple junction element 18 both comprise primary sections 17a, 18a connected to the conductor rails, secondary sections 17b, 18b and connecting sections 17c, 18c. The primary sections 17a, 18a are in physical contact with the conductor rails 15 and extend perpendicular to the conductor rails 15. The secondary sections 17b, 18b also extend perpendicular to the conductor rails 15, but are offset from the primary sections 17a, 18a. The connecting sections 17c, 18c connect the primary sections 17a, 18a to the secondary sections 17b, 18b. Because the primary sections 17a, 18a and the secondary sections 17b, 18b are offset from each other, the connecting sections 17c, 18c extend at least partly perpendicular to both these sections.

As a result of the arrangement of the extended heating elements 17 and the multiple junction element 18, they produce a power per unit length, and thus a heat flux, which varies along a line between their contact points 21 with the power supply, in this case the conductor rails 15. In particular, the connecting sections 17c, 18c project a greater power per unit length along this line than the primary sections 17a, 18a and the secondary sections 17b, 18b. This is because they extend at least partly perpendicular to this line. As a result of this, the heating device 12 as a whole generates a greater flux in regions near the conductor rails 15 than at other points. This at least partially compensates for known increased heat loss characteristics of the furnace 1 at these regions when in use.

Figure 5:
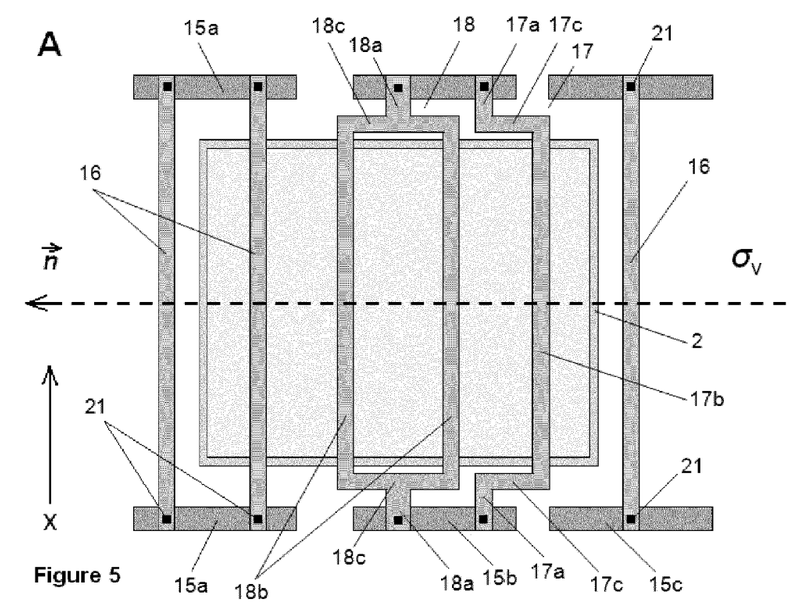
FIG. 5 is schematic plan view of an alternative arrangement of a heating device in accordance with the present invention in which independent power supplies are provided for heating elements.
Figure 6:
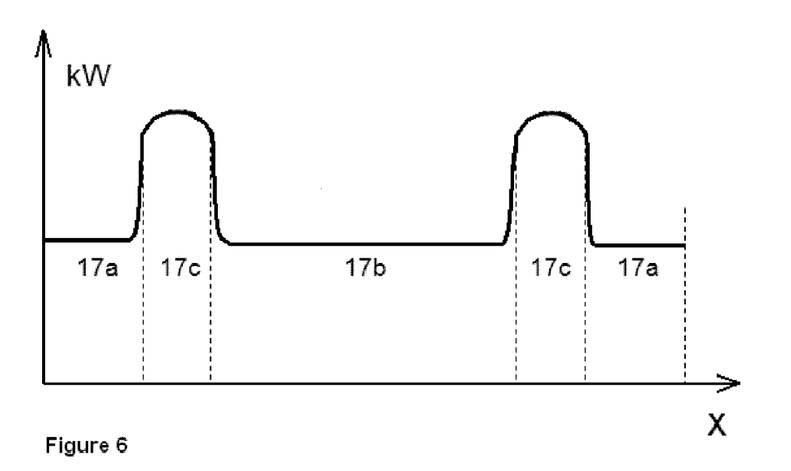
FIG. 6 illustrates the power per unit length of an element of the heating device of FIG. 4.

FIG. 6 figuratively illustrates the power per unit length of one of the extended heating elements 17 projected on an axis X which runs parallel to, and thus has the same projected power per unit length as, the line between the contact points of the extended heating elements 17 in the examples of FIGS. 4 and 5. As can be seen from the Figure, in the areas of the connecting sections 17c, the power per unit length is increased. In contrast, the power per unit length of the straight heating elements 16 would show no such characteristic and would be constant along the axis X.

So, a heating device 12 arranged as shown in FIG. 4 is able to compensate for the temperature gradient at position A shown in FIG. 2a). It will be appreciated that alternative arrangements may be used to achieve a similar effect.

In FIG. 4, the heating elements 16, 17, 18 share a common power supply through conductor rails 15. However, in some embodiments, a number of independent power supplies may be provided for the heating elements. For example, in FIG. 5 an arrangement is illustrated in which the conductor rails 15 are separated into distinct sections 15a, 15b and 15c. As a result, a number of independent power supplies are provided, each of which is coupled to one or more heating elements. Accordingly, the heating elements 16, 17, 18 may be separately controlled if required. This can allow dynamic control over the heat flux profile applied by the heating device 12 to the semiconductor material in the crucible 2.

Figure 7A:
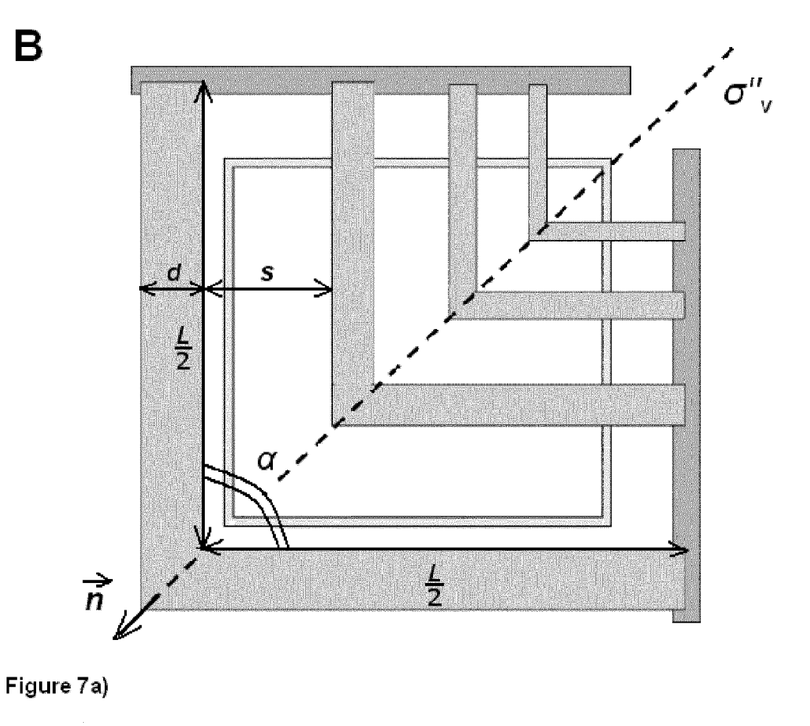
FIG. 7a) is schematic plan view of a further arrangement of a heating device in accordance with the present invention.

FIG. 7a) illustrates a first arrangement for a heating device 12 which may be used at position B of FIG. 2b).

In the arrangement shown in FIG. 7a), the conductor rails 15 are disposed perpendicular to each other. Heating elements are disposed between the conductor rails. In this case, the heating elements are bent at a right angle α in order to run between the conductor rails 15. Moreover, it can be seen from the Figure that the width d of the heating elements 15 is variable, as is the distance s between the conductor rails 15 and their total length L. In the example of FIG. 7a), variations such as these can be used to increase the heat flux provided in the top-right (as seen from the perspective of FIG. 7a) of the heating device 12. It will be recalled, that the top-right of the position B was relatively cold in the temperature distribution pattern shown in FIG. 2b).

Accordingly, the arrangement of FIG. 7a) is effective to compensate for the temperature gradient illustrated in FIG. 2b) and thus to increase the quality of the crystalline silicon which is formed in the crucible 2.

Figure 7B:
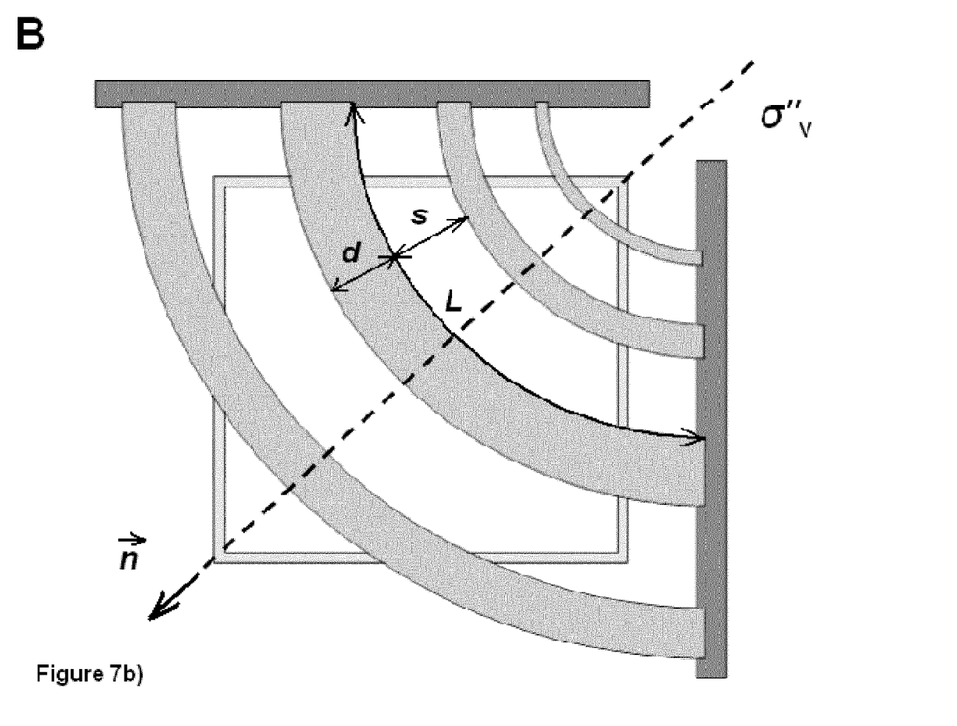
FIG. 7b) is schematic plan view of a still further arrangement of a heating device in accordance with the present invention.

FIG. 7b) illustrates an alternative arrangement for a heating device which may be used in position B. Again, the heating elements 16 have variable lengths L, separations s and widths d. The parameters L, d and s can be chosen to achieve the desired differential heat flux across the heating device 12.

The arrangement of FIG. 7b) differs from that of FIG. 7a) in that the heating elements are provided with a constant arc of curvature rather than being bent at a single point. It is found that this can increase the mechanical strength of the heating elements, particularly at the high temperatures required for crystalline semiconductor growth.

A plane of symmetry $\sigma''_v$ is shown in FIGS. 7a) and 7b). The plane of symmetry runs vertically through the process chamber, i.e. perpendicular to the horizontal cross-section of the semiconductor material. The heat flux profile applied by the heating device 12 to the horizontal cross-section of the semiconductor material in the crucible is symmetrical around this plane, as is the physical geometry of the heating device. This is the only plane of symmetry for the heat flux profile or the physical geometry of the heating device 12 and runs through the centre of the array of crucibles 2 in the furnace 1.

Figure 8A:
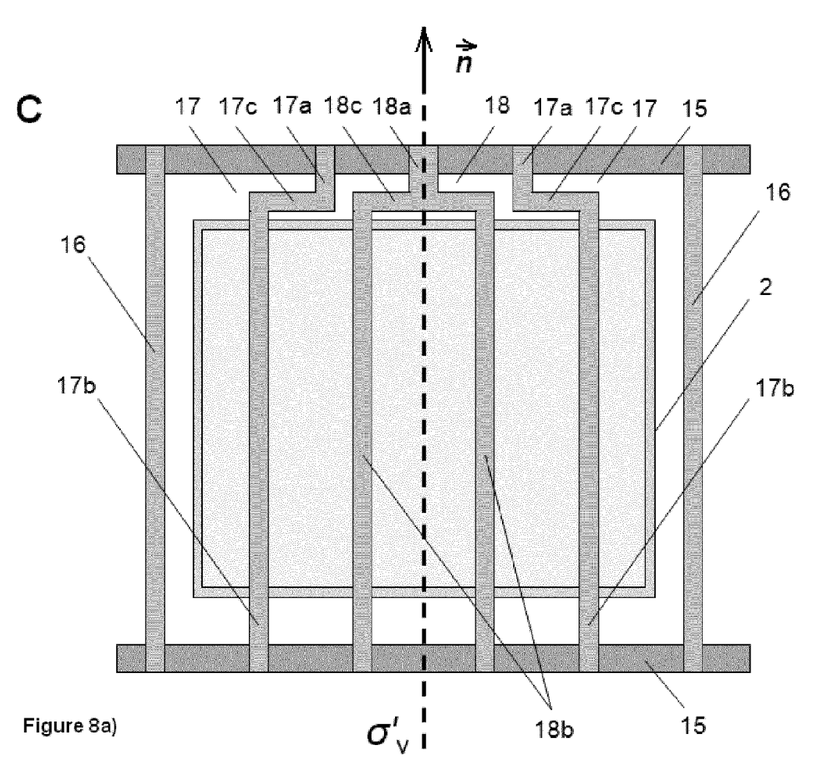
FIG. 8a) is schematic plan view of a yet further arrangement of a heating device in accordance with the present invention.
Figure 8B:
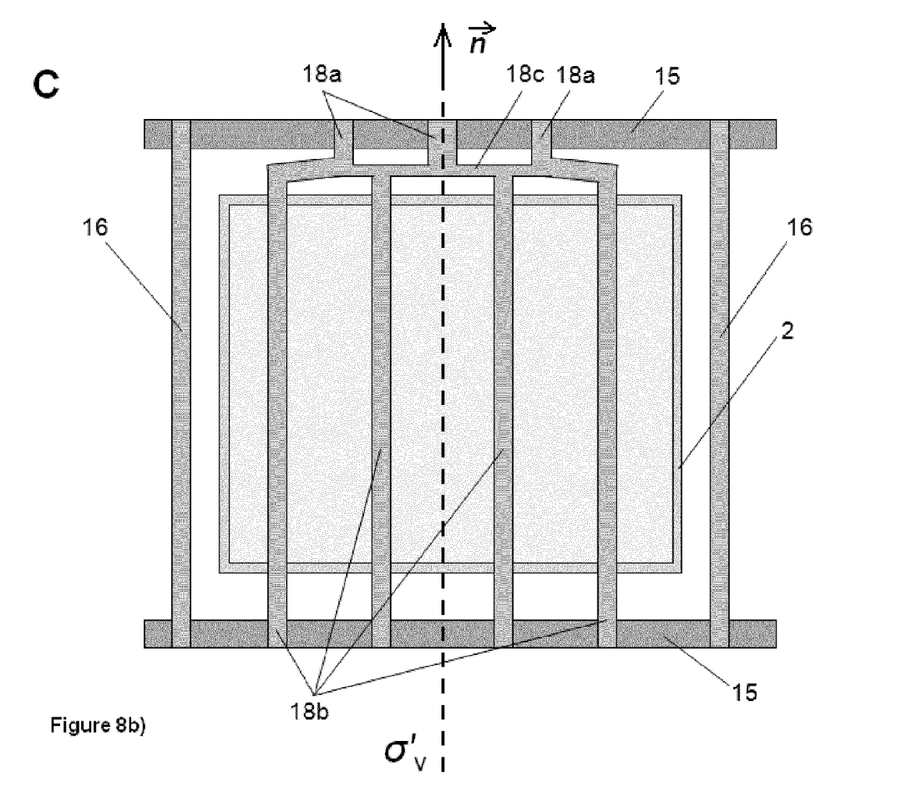
FIG. 8b) is schematic plan view of a still yet further arrangement of a heating device in accordance with the present invention.

FIGS. 8a) and 8b) show top views of the heating devices 12 which may be used at position C shown in FIG. 2c). With reference to the orientation of the process chamber 7 at position C shown in FIG. 2c), it will be recalled that the temperature distribution pattern shown in that Figure illustrated that the lower section of the process chamber is warmer than the upper section. Accordingly, the heating devices of FIGS. 8a) and 8b) are designed to counteract this non-uniformity by applying a greater heat flux towards the upper section.

In comparison with the heating device 12 shown in FIG. 4, the heating device 12 of FIG. 8a) includes no connecting sections 17c, 18c in a lower half of the extended heat elements 17 or the multiple junction element 18. This at least partially compensates for the difference in the heat loss characteristics of the process chamber between the top and bottom of the chamber 7 from the perspective of FIG. 8a).

The arrangement of the heating device 12 shown in FIG. 8b) also provides greater heat flux towards an upper section, but differs somewhat from that of FIG. 8a) in order to provide greater mechanical resilience. In the arrangement of FIG. 8b), the multiple junction element 18 comprises multiple primary sections 18a in contact with one of the conductor rails 15. This allows the multiple junction sheet 18 to support a larger number of secondary sections 18b.

The complex multiple junction element 18 of FIG. 8b) has some advantages over the combination of extended heating elements 17 and multiple junction element 18 of FIG. 8a). In particular, the arrangement shown in FIG. 8b) allows the turning moment applied at the junctions between the primary sections 18a and the connecting section 18b to be reduced, as compared to the equivalent property of an extended heating element 17. This reduces the possibility of mechanical failure, such as bending, of the element during use. This is particularly valuable given the high temperatures for which the furnace is designed.

A plane of symmetry $\sigma''_v$ is shown in FIGS. 7a) and 7b). The plane of symmetry runs vertically through the process chamber, i.e. perpendicular to the horizontal cross-section of the semiconductor material. The heat flux profile applied by the heating device 12 to the horizontal cross-section of the semiconductor material in the crucible is symmetrical around this plane, as is the physical geometry of the heating device. This is the only plane of symmetry for the heat flux profile or the physical geometry of the heating device 12 and runs through the centre of the array of crucibles 2 in the furnace 1.

In use, the furnace 1 is operated as follows. Firstly, a semiconductor material, preferably silicon, is placed within the crucible 2. The crucible 2 is then placed within the furnace in the position shown in FIG. 1. The support plates 8 are then placed around the crucible 2. The furnace is then closed and sealed. A gas flow system is then operated to evacuate the chamber, thereby reducing the pressure to less than 0.1 mbar. The gas flow system is then operated to generate a stable gas flow (for example of argon) through the inlet 13 and outlets 14 at a pressure of about 600 to 900 mbar. After the process of flushing the furnace with argon begins, a computer controller operates the top heating device 12. This causes the heating of the silicon above its melting temperature. A typical temperature for this is about 1420 to 1480 degrees Celsius. The heating persists until all of the silicon material is melted. Thereafter, the computer controller modulates the heating device 12 and the heat extraction mechanism 6 so as to cool the silicon material below its melting point and provide the controlled directional solidification of the material (a typical growth rate being about 1 to 3 cm/hour). During this process, the differential heat flux generated by the heating device 12 is effective to compensate for non-uniform heat loss characteristics of the furnace and thereby to reduce lateral temperature gradients across the silicon. This beneficially reduces defects such as dislocations in the crystalline silicon formed during solidification.

Following completion of the solidification the heating device 12 is deactivated. The silicon is then allowed to cool as the flow of process gas continues, thus providing an additional cooling effect. Once cooled, the furnace hot zone is then returned to atmospheric pressure. The chamber is opened when the temperature has reduced to below about 350 degrees Celsius and the solidified material is removed.

Figure 9A:
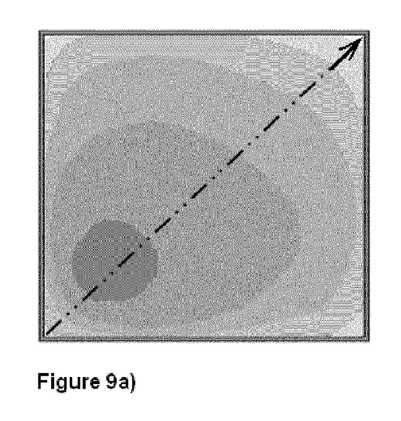
FIG. 9a) shows a plan view of the lateral temperature distribution across a horizontal cross-section of a semiconductor material under uniform heating, where the semiconductor material is in position B seen on FIG. 2b)

The beneficial effects of the present invention during this process can be understood with reference to FIGS. 9a), 9b), 10a) and 10b). FIGS. 9a) and 9b) show simulated temperature distribution profiles across a horizontal plane of a process chamber in position B as illustrated in FIG. 2b). In FIG. 9a), the heating device 12 is of a conventional type and provides a substantially uniform heat flux. As can be seen from FIG. 9a), the location of the process chamber in the furnace means that the resulting temperature distribution includes a hotter area towards the bottom left of the Figure, while the top right of the Figure is relatively cool. Thus, an unwanted temperature gradient is present across the process chamber 7.

Figure 9B:
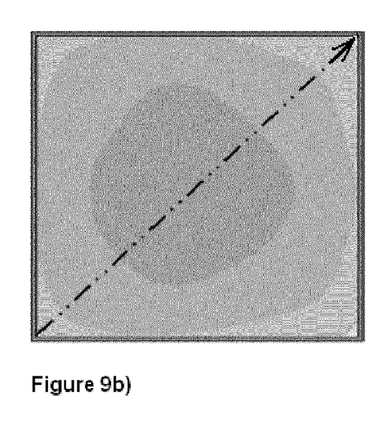
FIG. 9b) shows a plan view of the lateral temperature distribution across a horizontal cross-section of a semiconductor material under a predetermined differential heat flux profile, where the semiconductor material is in position B seen on FIG. 2b)

In FIG. 9b), the heating device 12 is adapted to provide a predetermined differential heat flux profile. For example, the heating device 12 may have an arrangement such as illustrated in FIGS. 7a) and 7b). As can be seen from FIG. 9b), the temperature gradient across the material is much reduced in comparison to FIG. 9a). This improves the quality of the process.

Figure 10A:
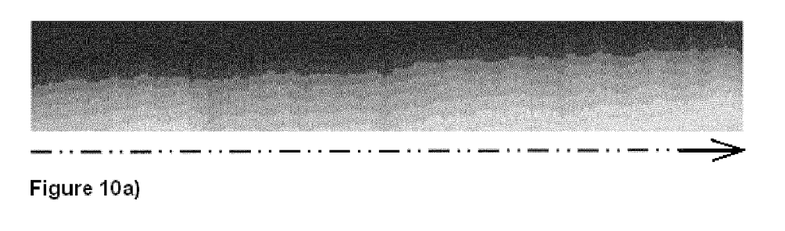
FIG. 10a) shows a vertical cross-sectional view of a crystallization profile of semiconductor crystalline material formed under uniform heating.
Figure 10B:
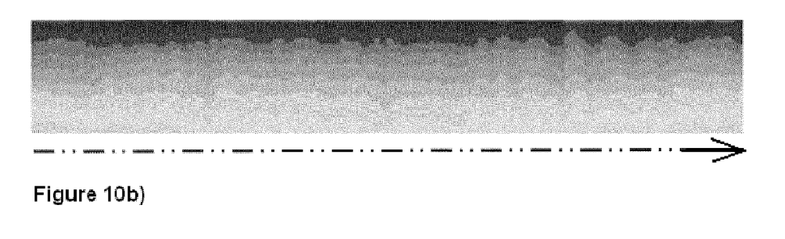
FIG. 10b) shows a vertical cross-sectional view of a crystallization profile of semiconductor crystalline material formed under a predetermined differential heat flux profile.

The benefits of the invention can also be seen from FIGS. 10a) and 10b), which show the propagation profile of crystalline semiconductor materials formed in the furnace along a cut-through illustrated by the dotted lines in FIGS. 9a) and 9b). This profile is mapped from resistivity iso-contours when boron-doped silicon is used as the semiconductor material, which shows the crystallization profile because the resistivity of the material formed varies as the crystallization process progresses, so that areas with the same resitivity can be understood to have formed at the same time.

FIGS. 10a) and 10b) represent crystallization front profiles corresponding to lateral temperature profiles in FIGS. 9a) and 9b) reflecting position B in FIG. 2b). FIG. 10a) shows the results when a conventional heating device 12 is used which offers a substantially uniform heat flux, while FIG. 10b) shows the results obtained when a heating device 12 such as that of FIGS. 7a) and 7b) is used. It is clear from comparison of the Figures, that the provision of a differential heat flux profile in accordance with the present invention improves the horizontal uniformity of the temperature, thereby improving the reliability of the crystallization process.

Variations and modifications to the above embodiments are possible without departing from the scope of the present invention. As mentioned above, the number of process chambers 7 within the furnace may vary. Moreover, while the description given above relates to the top heating device 12 of the preferred embodiments, similar arrangements can alternatively or additionally be used with respect to a bottom heating device or to side heating devices not shown in the preferred example embodiments. Moreover, the exact locations of the gas inlet and outlets may be varied according to requirements, as may the dimensions and physical geometry of other aspects of the furnace.

It will also be understood that various arrangements for the heating elements may be used. Moreover, the arrangements described above are not limited for use only in the furnaces described above. For example, the arrangements of FIGS. 7a)

and 7b) are optimised for use at position B of a 2×2 array as illustrated in FIG. 2b), but may also find utility in the corner positions of other arrays, such as a 3×2 array. In this latter example, the compensation provided by the differential heat flux profile of the particular arrangement may not perfectly counteract the side heat loss properties of the array, but are nevertheless advantageous as compared to the provision of uniform heating.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment.

Conversely, features which are described in the context of a single embodiment may also be provided separately or in any suitable sub-combination.

The invention claimed is:

1. A multi-ingot furnace for the growth of crystalline semiconductor material, the furnace comprising:
    a housing defining a hot zone for receiving an array of crucibles containing semiconductor material;
    at least one heating device for heating the semiconductor material;
    characterised in that
    the or each heating device is arranged to apply a predetermined differential heat flux profile to a horizontal cross-section of the semiconductor material in one or more crucibles, wherein the heat flux profile is selected in dependence on the position within the array of the one or more crucibles.

2. A furnace according to claim 1, the furnace comprising a plurality of heating devices, wherein each heating device is associated with a single crucible and is arranged to apply the predetermined differential heat flux profile to the horizontal cross-section of semiconductor material in the associated single crucible.

3. A furnace according to claim 1, wherein the predetermined differential heat flux profile comprises only one plane of symmetry perpendicular to the horizontal cross-section of the semiconductor material, and the plane of symmetry passes through a geometric centre of the array.

4. A furnace according to claim 3, wherein the physical geometry of the heating device is symmetrical with respect to the plane of symmetry of the predetermined differential heat flux profile which passes through a geometric centre of the array.

5. A furnace according to claim 3, wherein the predetermined heat flux profile varies along a line of intersection between the horizontal cross-section of the semiconductor material and the plane of symmetry of the predetermined differential heat flux profile which passes through a geometric centre of the array.

6. A furnace according to claim 1, wherein the heating device is a resistance heater comprising at least one resistive heating element.

7. A furnace according to claim 6, wherein heating device comprises a plurality of resistive heating elements, and wherein the resistive heating elements are provided in at least two differing configurations.

8. A furnace according to claim 7, wherein at least two differing configurations comprise variations in physical geometry of the resistive heating elements.

9. A furnace according to claim 6, wherein at least one resistive heating element is configured to generate a variable total heat flux per unit length projected on a line passing through its contact points with a power supply.

10. A furnace according to claim 9, wherein the at least one heating element extends between parallel conductor rails and comprises:
    at least one primary section in contact with one of the conductor rails;
    one or more secondary sections, wherein the at least one primary section and the one or more secondary sections extend perpendicular to the conductor rails, and are offset from one another, and
    a connecting section extending between at least one primary section and the one or more secondary sections, such that heating element generates increased total heat flux per unit length along the line passing through its contact points in the region of the connecting section.

11. A furnace according to claim 1, wherein the furnace further comprises a plurality of process chambers within the hot zone, wherein each chamber is arranged to receive one of the crucibles of the array.

12. A furnace according to claim 1, wherein the or each heating device is a top heating device disposed above the semiconductor material.

13. A furnace according to claim 1, wherein the or each heating device comprises a plurality of heating elements arranged in a plurality of groups, wherein the heating device further comprises an independent power supply for each group.

14. A furnace according to claim 1, further comprising at least one separator disposed between the or each heating device and the semiconductor material.

15. A furnace according to claim 1, wherein the crystalline semiconductor material is for use as photovoltaic material for converting incident radiation into electrical charge.

16. A method of operating a multi-ingot furnace for the growth of a crystalline semiconductor material, wherein the method comprises heating a process chamber using a heating device which applies a predetermined differential heat flux profile to a horizontal cross-section of semiconductor material within one or more crucibles, the predetermined differential heat flux profile being selected in dependence on the position of the one or more crucibles within an array.

17. A method according to claim 16, wherein the crystalline semiconductor material is for use as photovoltaic material for converting incident radiation into electrical charge.

18. A method of growing crystalline semiconductor material, comprising:
    loading a furnace process chamber with material to be heated;
    closing the furnace;
    evacuating the air within the process chamber;
    supplying a flow of the gas into the process chamber;
    heating the material while performing the method according to claim 16;
    cooling the material;
    evacuating the gas;
    aligning the pressure in the process chamber to atmospheric pressure;
    opening the furnace; and
    removing the material.

* * * * *